US011521883B2

(12) United States Patent
Chen

(10) Patent No.: US 11,521,883 B2
(45) Date of Patent: Dec. 6, 2022

(54) LOAD LOCK DEVICE HAVING OPTICAL MEASURING DEVICE FOR ACQUIRING DISTANCE

(71) Applicant: NANYA TECHNOLOGY CORPORATION, New Taipei (TW)

(72) Inventor: Chia-Fu Chen, Taoyuan (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 141 days.

(21) Appl. No.: 17/191,160

(22) Filed: Mar. 3, 2021

(65) Prior Publication Data
US 2022/0285195 A1    Sep. 8, 2022

(51) Int. Cl.
| | |
|---|---|
| H01L 21/68 | (2006.01) |
| H01L 21/67 | (2006.01) |
| H01L 21/677 | (2006.01) |
| C23C 14/48 | (2006.01) |
| C23C 14/56 | (2006.01) |
| G01S 17/08 | (2006.01) |
| H01J 37/22 | (2006.01) |
| H01J 37/20 | (2006.01) |
| H01J 37/317 | (2006.01) |
| C23C 14/54 | (2006.01) |

(52) U.S. Cl.
CPC ............ *H01L 21/681* (2013.01); *C23C 14/48* (2013.01); *C23C 14/54* (2013.01); *C23C 14/566* (2013.01); *G01S 17/08* (2013.01); *H01J 37/20* (2013.01); *H01J 37/228* (2013.01); *H01J 37/3171* (2013.01); *H01L 21/67265* (2013.01); *H01L 21/67754* (2013.01); *H01L 21/67757* (2013.01); *H01L 21/67778* (2013.01); *H01J 2237/20292* (2013.01); *H01J 2237/31701* (2013.01)

(58) Field of Classification Search
CPC ............ H01L 21/681; H01L 21/67265; H01L 21/67754; H01L 21/67757; H01L 21/67778; C23C 14/48; C23C 14/54; C23C 14/566; G01S 17/08; H01J 37/20; H01J 37/228; H01J 37/3171; H01J 2237/20292; H01J 2237/31701
See application file for complete search history.

(56) References Cited

U.S. PATENT DOCUMENTS

| | | | | |
|---|---|---|---|---|
| 8,122,846 | B2 * | 2/2012 | Stiblert | G03F 7/704 427/595 |
| 10,157,722 | B2 * | 12/2018 | Hatakeyama | G01N 23/223 |
| 10,566,169 | B1 * | 2/2020 | Bennahmias | H01J 29/80 |
| 2002/0021959 | A1 * | 2/2002 | Schauer | H01L 21/67259 414/744.2 |
| 2002/0189122 | A1 * | 12/2002 | Lappen | H01L 21/68 33/645 |

(Continued)

*Primary Examiner* — David A Vanore
(74) *Attorney, Agent, or Firm* — Muncy, Geissler, Olds & Lowe, P.C.

(57) ABSTRACT

The present disclosure provides a substrate processing apparatus including at least one input/output chamber. The load lock device includes a base, a guide rail, a platform and an optical measuring module. The guide rail is connected to the base. The platform, carrying a cassette for holding a batch of spaced substrates, is movably disposed on the guide rail. The optical measuring module is configured to acquire an actual moving distance traveled by the platform along the guide rail based on at least one optical signal reflected from the platform.

16 Claims, 10 Drawing Sheets

(56) References Cited

U.S. PATENT DOCUMENTS

| | | | | |
|---|---|---|---|---|
| 2003/0130761 A1* | 7/2003 | Schauer | ............ | H01L 21/67265 |
| | | | | 700/213 |
| 2004/0112537 A1* | 6/2004 | Yamazaki | ........... | C23C 16/5093 |
| | | | | 156/345.31 |
| 2005/0045821 A1* | 3/2005 | Noji | ..................... | G01N 23/225 |
| | | | | 250/311 |
| 2008/0032066 A1* | 2/2008 | Stiblert | ................... | G03F 7/704 |
| | | | | 29/559 |
| 2009/0082895 A1* | 3/2009 | Barker | .................... | H01L 21/68 |
| | | | | 414/800 |
| 2012/0235036 A1* | 9/2012 | Hatakeyama | ........... | H01J 37/20 |
| | | | | 250/310 |
| 2016/0133502 A1* | 5/2016 | Won | ....................... | B25J 9/1679 |
| | | | | 901/46 |
| 2016/0307726 A1* | 10/2016 | Hatakeyama | ......... | H01J 37/265 |
| 2020/0035452 A1* | 1/2020 | Bennahmias | ........... | H01J 37/04 |
| 2022/0285195 A1* | 9/2022 | Chen | ................... | H01J 37/3171 |

* cited by examiner

LOAD LOCK DEVICE HAVING OPTICAL MEASURING DEVICE FOR ACQUIRING DISTANCE

TECHNICAL FIELD

The present disclosure relates to a substrate processing apparatus, and more particularly, to a substrate processing apparatus which includes a load lock device having functionality of acquiring a moving distance of a cassette accommodating substrates.

DISCUSSION OF THE BACKGROUND

Carriers for holding a batch of spaced semiconductor substrates are employed in many types of semiconductor substrate processing systems to facilitate batch processing and to minimize damage to the wafers due to improper handling. Such carriers are employed, for example, as input magazines for sequentially supplying semiconductor substrates to automatic substrate handling and processing systems, as output magazines for sequentially receiving processed semiconductor substrates from such systems, or as intermediate (throughput) devices for holding semiconductor substrates that may require sampling, testing, or some other special handling at some point during processing by such systems.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a substrate processing apparatus. The substrate processing apparatus includes a controller and at least one input/output chamber provided with a load lock device. The load lock device includes a base, a guide rail, and an optical measuring module. The guide rail is connected to the base. The platform, carrying a cassette for holding a batch of spaced substrates, is movably disposed on the guide rail. The optical measuring module is configured to acquire an actual moving distance traveled by the platform along the guide rail based on at least one optical signal reflected from the platform. The optical measuring module comprises a processor electrically coupled to the controller.

In some embodiments, the load lock device further includes a motor electrically coupled to the processor and configured to move the platform upward and downward along the guide rail. The controller is configured to generate a preset moving distance for moving the platform, wherein the preset moving distance is provided to the processor and eventually the motor, and the processor is configured to compare a difference between the preset moving distance and the actual moving distance and issue an alarm if the difference is greater than a threshold.

In some embodiments, the optical measuring module further includes a display for displaying the actual moving distance and a comparison result provided by the processor.

In some embodiments, the optical measuring module further includes a light emitter and a light receiver. The light emitter is electrically coupled to the processor and configured to generate light having a specific wavelength, and the light receiver is electrically coupled to the processor and configured to receive light having the specific wavelength. Light generated by the light emitter is projected to the platform, reflected by the platform, and impinges on the light receiver, and the processor is configured to determine the actual moving distance based on an amount of light impinging on the light receiver.

In some embodiments, the optical measuring module further includes a light reflector disposed on the platform and in an optical propagation path of light to direct light generally to the light receiver.

In some embodiments, the light emitter and the light receiver are disposed on the base.

In some embodiments, the optical measuring module further includes a light emitter and a light receiver. The light emitter is electrically coupled to the processor and configured to generate at least one light pulse having a specific wavelength, and the light receiver is electrically coupled to the processor and configured to receive the light pulse having the specific wavelength. The light pulse generated by the light emitter is projected to the platform, reflected by the platform, and impinges on the light receiver, and the processor is configured to determine the actual moving distance based on a travel time of the light pulse from the light emitter to the light receiver.

In some embodiments, the substrate processing apparatus further includes a transfer chamber and a processing chamber, the transfer chamber includes a handler electrically coupled to the controller, and the processing chamber is provided with an ion implant device for implanting the substrates.

In some embodiments, the substrate processing apparatus further includes a plurality of gate valves electrically coupled to the controller. During a close operation, the gate valves are employed to hermetically isolate the input/output chamber form the processing chamber. During an open operation, the gate valves allow the handler to load and unload the substrates.

Another aspect of the present disclosure provides a substrate processing apparatus. The substrate processing apparatus includes a controller and at least one input/output chamber provided with a load lock device. The load lock device includes a base, a guide rail and an optical measuring module. The guide rail is connected to the base. The platform, carrying a cassette for holding a batch of spaced substrates, is movably disposed on the guide rail. The optical measuring module is electrically coupled to the controller and configured to acquire an actual moving distance traveled by the platform along the guide rail based on at least one optical signal transmitted directly from a light emitter to a light receiver.

In some embodiments, the light emitter and the light receiver are disposed on the base and the platform respectively.

In some embodiments, the actual moving distance traveled by the platform along the guide rail is determined based on an amount of light impinging on the light receiver.

In some embodiments, the actual moving distance traveled by the platform along the guide rail is determined based on a travel time of the light pulse from the light emitter to the light receiver.

In some embodiments, the optical measuring module further includes a processor electrically coupled to the light emitter and the light receiver, the load lock device further comprises a motor electrically coupled to the processor and configured to move the platform upward and downward along the guide rail, the controller is configured to generate a preset moving distance for moving the platform, wherein the preset moving distance is provided to the processor and eventually the motor, and the processor is configured to compare a difference between the preset moving distance and the actual moving distance and issue an alarm if the difference is greater than a threshold.

In some embodiments, the optical measuring module further includes a display for displaying the actual moving distance and a comparison result provided by the processor.

In some embodiments, the substrate processing apparatus further includes a transfer chamber, a processing chamber, and a plurality of gate valves. The transfer chamber includes a handler electrically coupled to the controller, and the processing chamber is provided with an ion implant device for implanting the substrates. The gate valves are electrically coupled to the controller. During a close operation, the gate valves are employed to hermetically isolate the input/output chamber from the processing chamber. During an open operation, the gate valves allow the handler to load and unload the substrates.

With the above-mentioned configurations of the load lock device, wherein the platform is moved with respect to the base in accordance with the preset moving distance provided by the controller electrically coupled to the load lock device, the actual moving distance of the platform along the guide rail can be monitored, thereby reducing costs resulting from substrate scraping.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1:
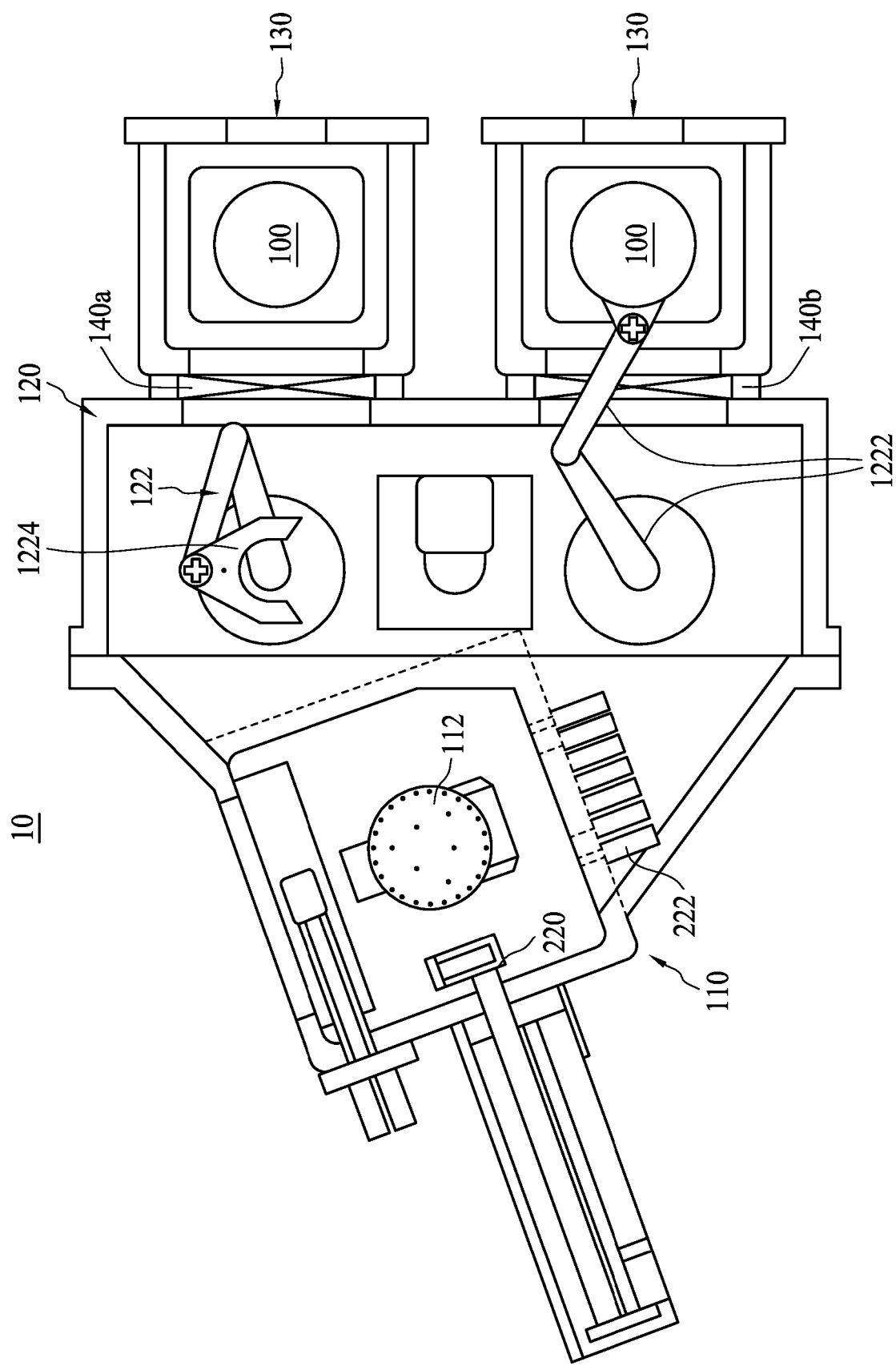
FIG. 1 is a plan view of a substrate processing apparatus in accordance with some embodiments of the present disclosure.

Embodiments, or examples, of the disclosure illustrated in the drawings are described below using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a plan view of a substrate processing apparatus 10 in accordance with some embodiments of the present disclosure. Referring to FIG. 1, the substrate processing apparatus 10, for processing semiconductor substrates 100, such as silicon wafers, includes a processing chamber 110 in which the substrates 100 are processed, a transfer chamber 120 through which the substrates 100 are moved before and after processing in the processing chamber 110, and one or more input/output chambers 130 that store the substrates 100 before and after the substrates 100 are moved through the transfer chamber 120.

The transfer chamber 120 includes at least one handler 122 adapted to pick up, transfer, and deliver substrates 100 among the processing chamber 110 and the input/output chambers 130. The handler 122 can have a plurality of arms 1222 interconnected with each other to permit a substrate retainer 1224 to move radially for picking up and depositing the substrates 100 while maintaining a desired angular orientation of the substrates 100.

The substrate processing apparatus 10 further includes a plurality of gate valves 140a and 140b, which are configured to isolate the processing chamber 110 from the input/output chambers 130. The gate valves 140a and 140b can be opened or closed. When the gate valves 140a and 140b are in the closed position, the gate valves 140a and 140b seal the input/output chambers 130, so that the input/output chambers 130 are hermetically isolated from the transfer chamber 120. When the gate valves 140a and 140b are in the open position, the gate valves 140a and 140b allow the handler 122 to load and unload the substrates 100 placed in the processing chamber 110 and the input/output chambers 130. Each of the gate valves 140a and 140b is open only when a substrate 100 passes through the gate valve 140a and 140b, and closed at all other times.

Figure 2:
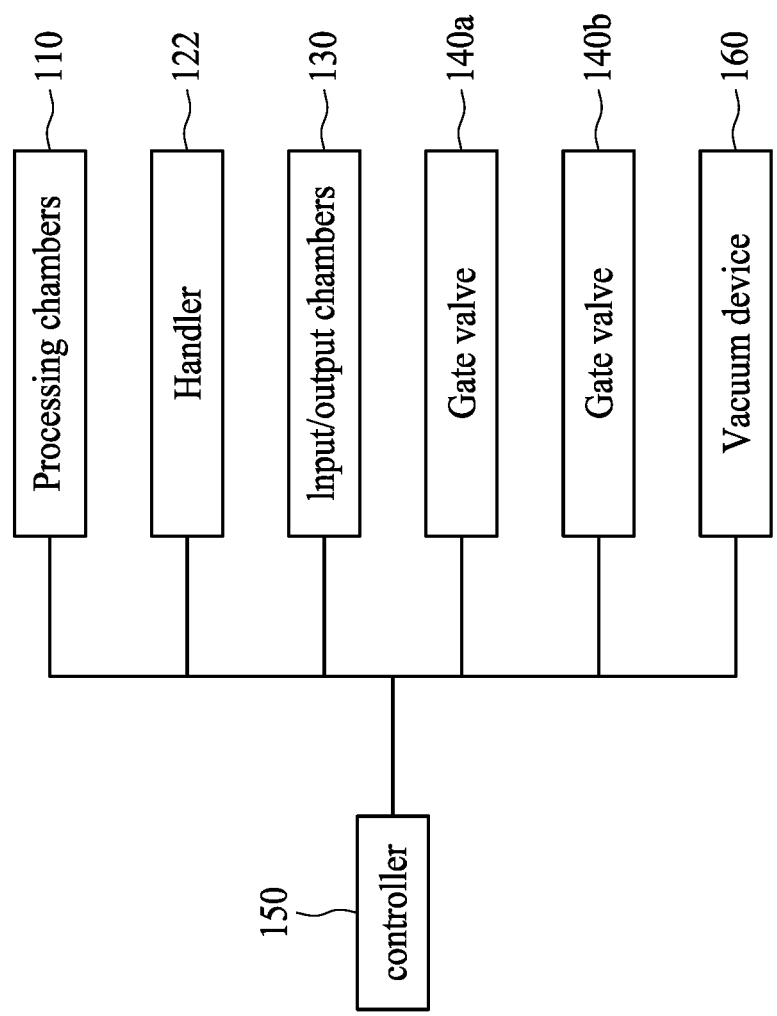
FIG. 2 is a circuit block diagram of the substrate processing apparatus in accordance with some embodiments of the present disclosure.

The substrates 100 to be processed ("untreated substrates") stored in one of the input/output chambers 130 can be transferred to the processing chamber 110 by the handler 122, which operates coordination with the open and close operations of the gate valve 140a. After undergoing one or more treatments, the treated substrates 100 ("treated substrates") can be transferred from the processing chambers 110 to the other input/output chamber 130 by the handler 122, which operates in coordination with the open and close operations of the gate valve 140b. The complete operation of conveying the substrates 100 can be controlled by a controller 150, which is electrically connected to the handler 122 and the gate valves 140a and 140b, as shown in FIG. 2. The controller 150 may reside in a personal computer (PC) including a memory used to store instructions for the controller 150 to execute or data for the controller 150 to operate on. The controller 150 can perform additional operations, functions, and control of an ion implant device 20, configured to implant ions into the substrate 100 positioned in the processing chamber 110, during the execution of the instructions. In alternative embodiments, the PC may further include a central processing unit (CPU) controlling and coordinating operations of the PC.

Referring to FIG. 2, the controller 150 can control some or all of the operations of the substrate processing apparatus 10. More particularly, the controller 150 can determine whether to open or close each of the gate valves 140a and 140b, in accordance with a conveyance path of the handler 122. In addition, the various treatments at the processing chamber 110 can be set by modifying the program of the controller 150. That is, the treatment can be affected at the processing chamber 110 in accordance with a modified treatment sequence. For example, the controller 150 may execute machine-readable control instructions to control the chamber pressure, chamber temperature, process timing, and other parameters of a particular process performed in the processing chamber 110. The processing chamber 110 is evacuated to at least one predetermined pressure by at least one vacuum device 160 electrically coupled to the controller 150.

Figure 3:
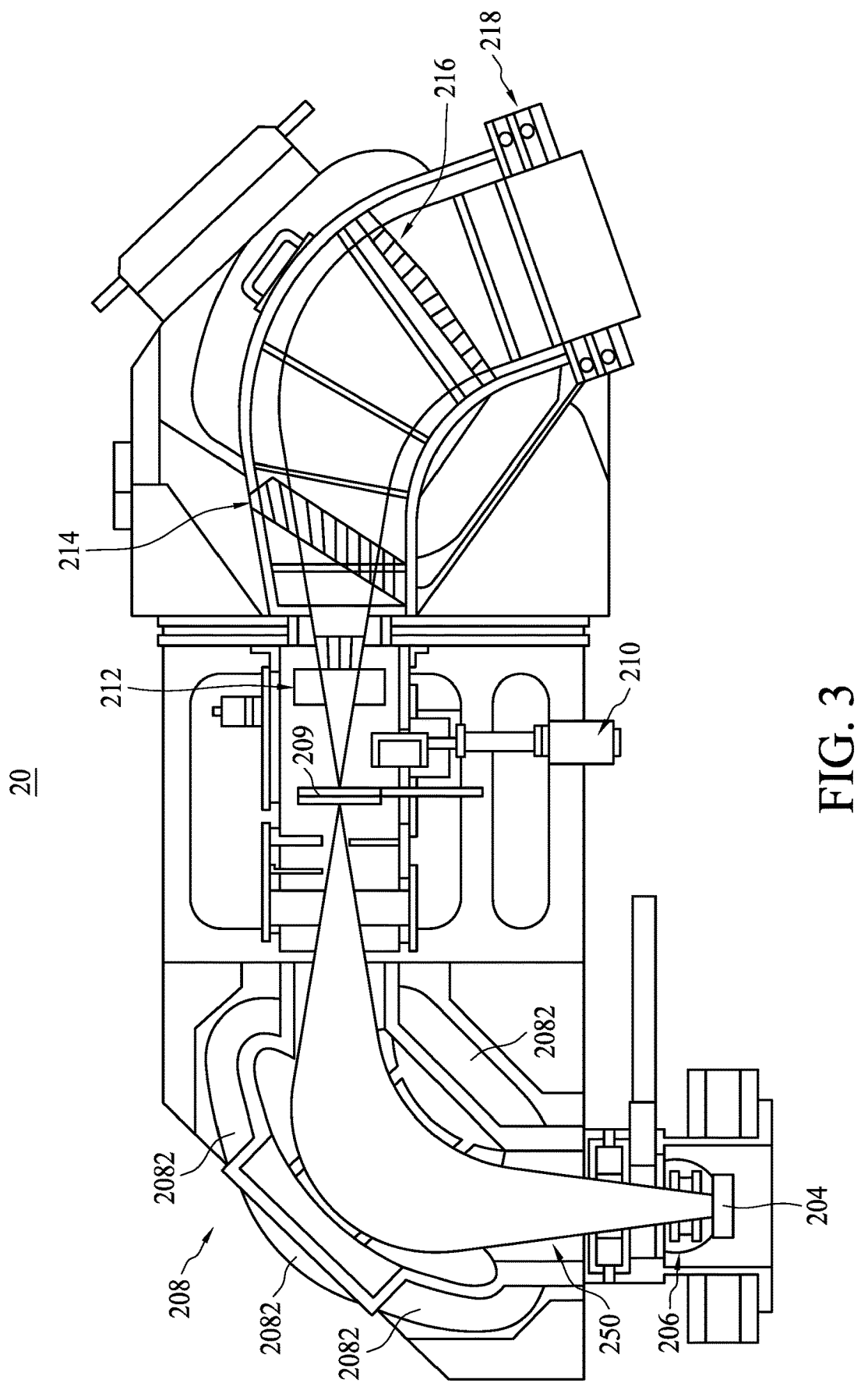
FIG. 3 is a schematic diagram of an ion implant device in accordance with some embodiments of the present disclosure.
Figure 4:
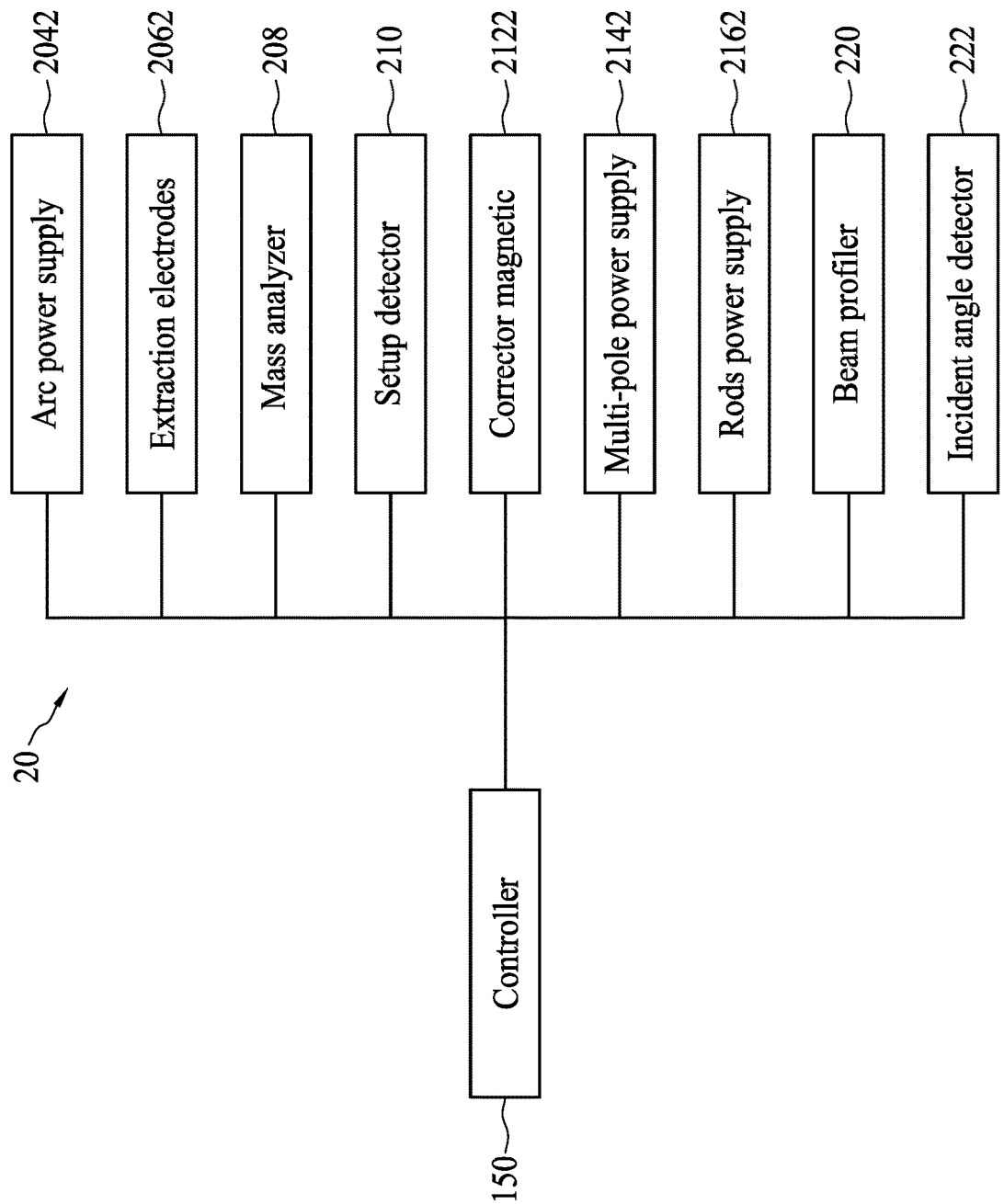
FIG. 4 is circuit block diagram showing interconnections between a controller and the ion implant device in accordance with some embodiments of the present disclosure.

FIG. 3 is a schematic diagram of the ion implant device 20 in accordance with some embodiments of the present disclosure. FIG. 4 is a circuit block diagram of the ion implant device 20 in accordance with some embodiments of the present disclosure. Referring to FIGS. 3 and 4, the ion implant device 20 is configured to implant ions into the substrate 100. The ion implant device 20 for implanting the substrate 100 with an ion beam 250 includes an ion source 204, a source manipulator 206, a mass analyzer 208, a setup detector 210, a beam manipulator 212, a multipole unit 214, one or more upper/lower rods 216 and a suppression assembly 218.

The ion source 204 functions to ionize an ionizable dopant gas, such as $BF_3$, $BCl_3$, $PH_3$, $AsH_3$, or $SiCl_4$, containing the ion species to be implanted, for example, boron (B), phosphorus (P), or arsenic (As). Energy generated by an arc power supply 2042 is imparted to the ionizable dopant gas to generated ions within the ion source 204. In some embodiments, the gas is ionized mainly by the bombardment of the atoms or molecules with electrons from arc discharge collisions.

Ions generated within the ion source 204 are extracted by the source manipulator 206 to form an ion beam 250, wherein the ion beam 250 is a mixture of different fractions of molecules and atoms of the source feed material. The source manipulator 206 can include one or more extraction electrodes 2062 electrically coupled to the controller 150 and operable to accelerate and extract positive ions out of the ion source 204. In some embodiments, the extraction electrodes 2062 are grounded to extract the positively-charged ions exit the ion source 204 and form the ion beam 250.

When high purity is required, the ion beam 250 is directed through the mass analyzer 208 for mass analysis to determine the species to be implanted. In addition, the magnetics 2082 may focus the ions beam 250 in both dimensions, deflect it, and is arranged so that the ion beam 250 passes cleanly through a resolving aperture 209. In some embodiments, the mass analyzer 208 can include a plurality of magnetics 2082, such as electromagnetics, that provide a magnetic field across the ion beam 250, thereby deflecting ions from the ion beam 250 at varying trajectories according to a charge-to-mass ratio of the ions. Specifically, the magnetics 2082 is operatively coupled to the controller 150, which is operable to control the strength (and orientation) of the magnetic field of the magnetics 2082.

The setup detector 210 is configured to measure physical parameters of the ion beam 250 having desired ions. The setup detector 210 of a movable measurement type can be retreated between a beam scan position and a retreated position. Specifically, the setup detector 210 measures the physical parameters at the beam scan position while moving from the retreated position in the vertical direction to be orthogonal to the ion beam 250 and immediately behind the resolving aperture 209. The setup detector 210 is retreated from the beam scan position after measurement. The setup detector 210 is further configured to generate an implantation profile based on the measured physical parameters, including one or more of a current of the ion beam 250 (i.e., the beam current) and a spot size of the ion beam 250.

The beam manipulator 212 accepts the ion beam 250 leaving the resolving aperture 209 and is used to manipulate a shape of the ion beam 250. The beam manipulator 212 may manipulate the shape of the ion beam 250 using an electrical field generated by a plurality of corrector magnetics 2122 extending across the beam path to tailor a precise one-dimensional beam current distribution which yields a uniform implantation dose. In some embodiments, the corrector magnetics 2122 may be electromagnetics electrically coupled to the controller 150. The multipole unit 214 and the upper/lower rods 216 accepts the divergent ion beam 250 leaving the beam manipulator 212, and deflect and renders it parallel in both dimensions. In some embodiments, the multipole unit 214 and the upper/lower rods 216 may deflect the ion beam 250 by electricity provided by a multi-pole power supply 2142 and a rods power supply 2162. By adjusting the electricity supplied to the multipole unit 214 and the upper/lower rods 216 using the controller 150, the ion beam 250 can be directed to the processing chamber 110. The suppression assembly 218 focuses the ion beam 250 to reduce angular divergence and space size.

Referring again to FIGS. 1 and 4, the ion implant device 20 may further includes a beam profiler 220 and an incident angle detector 222 disposed in the processing chamber 110 and electrically coupled to the controller 150. The beam profiler 220 is located near an implant plane 112 that supports the substrate 100 and configured to measure an implant current of the ion beam 250 in the vicinity of the implant plane 112, and the incident angle detector 222 may be located behind the implant plane 112 to measure the incident angle of the ion beam 250.

The controller 150 automates operation of the ion implant device 20, as shown in FIG. 4. Referring to FIG. 4, the controller 150 is connected to the arc power supply 2042 of the ion source 204 to control the power for ionizing the feed gas. The controller 150 is connected to the extraction electrodes 2062 of the source manipulator 206 and the magnetic analyzer 208 to control the magnetic field applied to the ions, thereby selecting the ions for inclusion into the ion beam 250. The controller 150 is connected to the corrector magnetic 2122, the multi-pole power supply 2142 and the rods power supply 2162 to control the divergent and incident angle of the ion beam 250 at the implant plane 102.

Referring again to FIG. 1, the untreated substrates 100 are set in one of the input/output chambers 130 coupled to the gate valve 140a and transferred sheet by sheet to the processing chamber 110 by the handler 122. The substrate 100 undergoes various treatments at the processing chamber 110 in accordance with a predetermined order, and is then transferred to the input/output chamber 130 coupled to the gate valve 140b by the handler 122. In some embodiments, the substrate processing apparatus 10 has only one input/output chamber 130 for accommodating the untreated and treated substrates 100.

Figure 5:
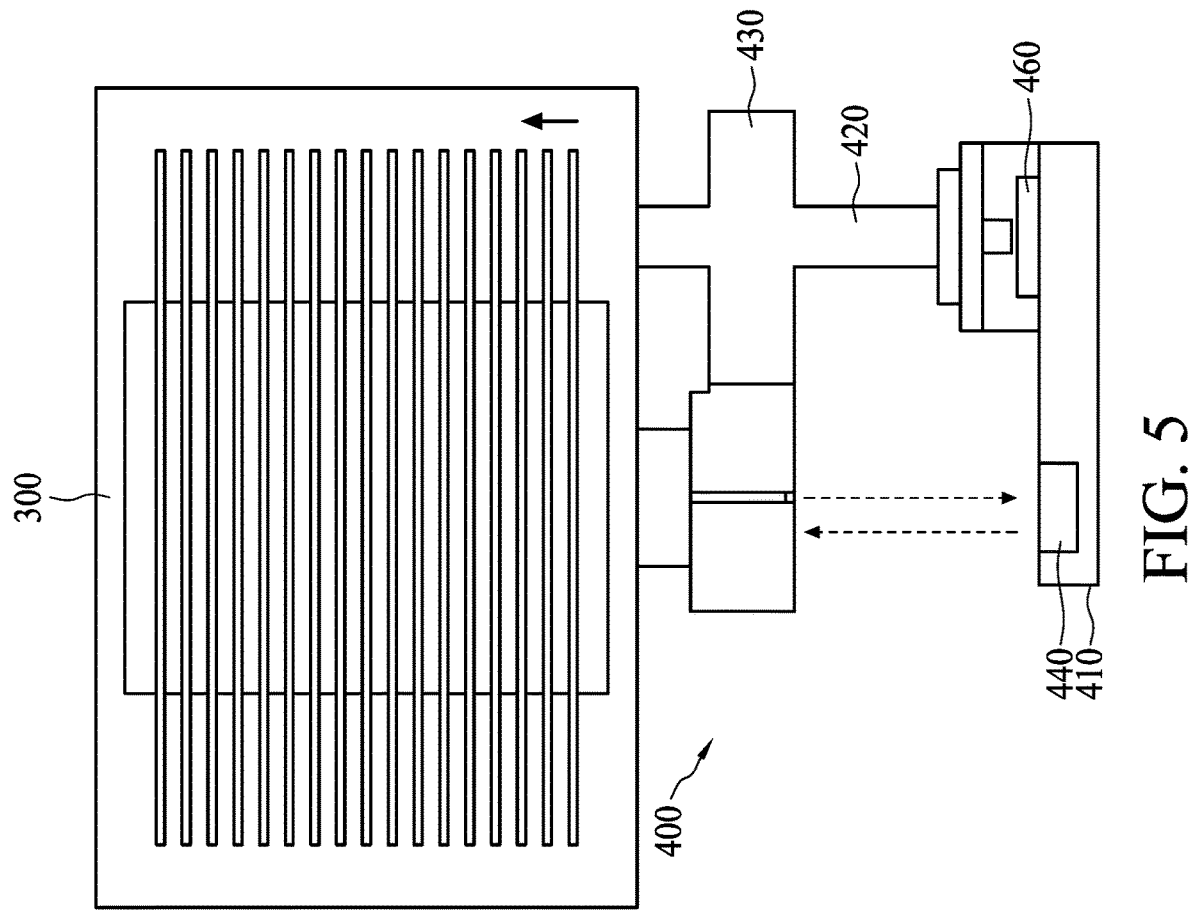
FIG. 5 is a cross-sectional view of a load lock device for carrying a cassette in accordance with some embodiments of the present disclosure.

FIG. 5 is a cross-sectional view of a cassette 300 and a load lock device 400 in the input/output chamber 130 in accordance with some embodiments of the present disclosure. Referring to FIG. 5, the input/output chambers 130, serving as containers accommodating the substrates 100 held in the cassette 300, include the load lock devices 400 employed to temporarily load the substrates 100 in a multi-staged state. In some embodiments, the substrates 100 in the input/output chamber 130 can be atmospherically isolated and purged of particulates before being moved into the transfer chamber 120 and eventually into the processing chamber 110.

The load lock device 400 includes a base 410, a guide rail 420 fixed to the base 410, a platform 430 movably disposed on the guide rail 420, and an optical measuring module 440 employed to acquire an actual moving distance traveled by the platform 430 along the guide rail 420 based on at least one optical signal reflected by the platform 430. The optical measuring module 440 can be disposed on or in the base 410, wherein the optical measuring module 440 disposed in the base 410 provides not only an improvement in mechanical properties, but also a highly aesthetic appearance.

Figure 6:
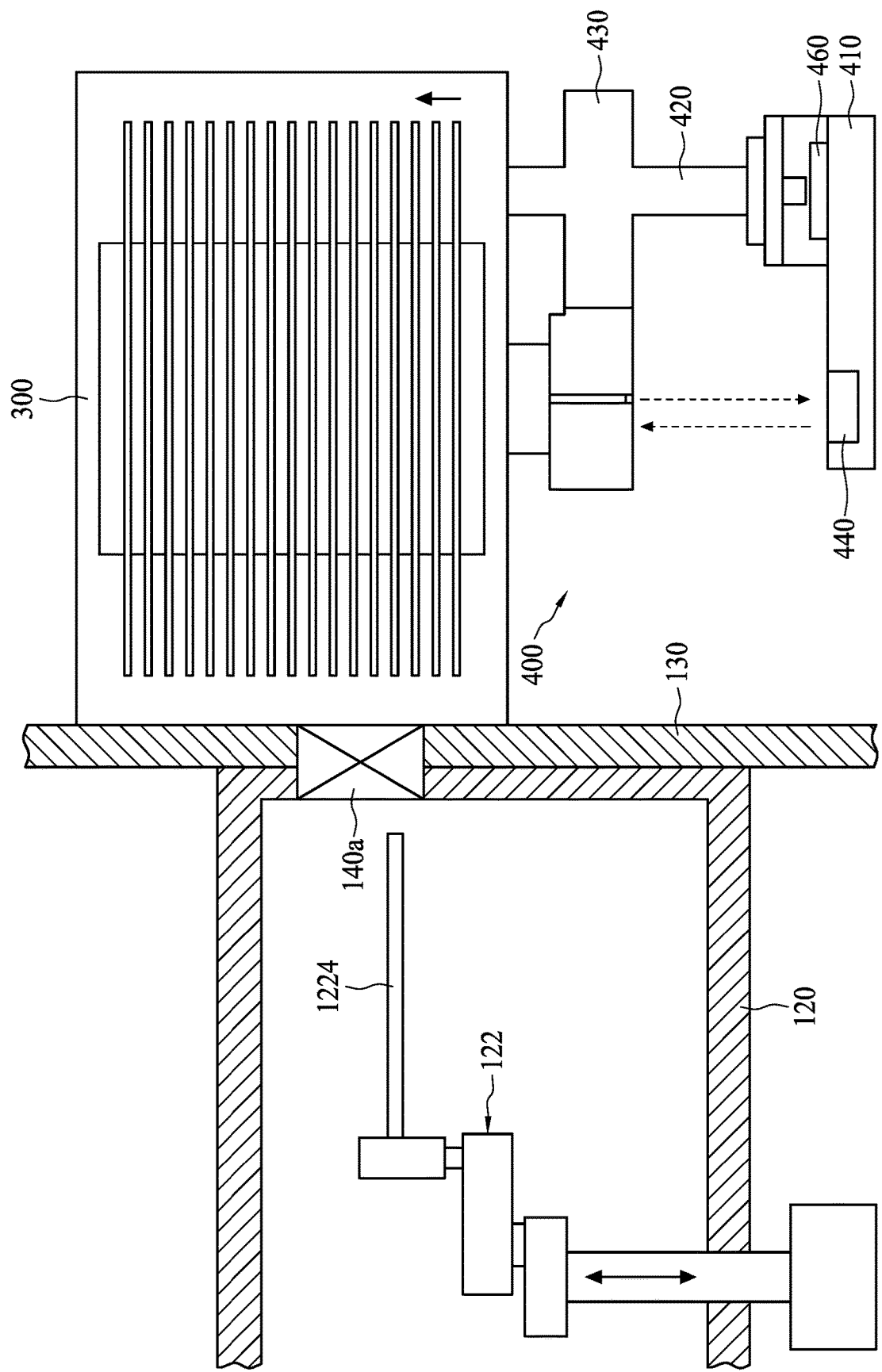
FIG. 6 is a cross-sectional view of a transfer chamber, an input/output chamber and a gate valve in accordance with some embodiments of the present disclosure.

The load lock device 400 further includes a motor 460 configured to drive the platform 430 to move upward and downward with respect to the base 410, so as to move the entire cassette 300 holding a batch of spaced substrates 100 up and down. Referring to FIG. 6, the platform 430 in one of the input/output chambers 130 is moved to cause a selected untreated substrate 100 to be aligned with the gate valve 140a, so that the substrate retainer 1224 can extend into the cassette 300 and successfully and rapidly pick up the selected untreated substrate 100 while the gate valve 140a is open. The platform 430 in the other input/output chamber 130 is moved to cause a spaced stage in the cassette 300 for placing a treated substrate 100 to be aligned with the gate valve 140a, so that the substrate retainer 1224 can transfer the treated substrate 100 to the spaced stage. Thus, if the untreated substrate 100 or the spaced stage is not positioned to be aligned with the gate valve 140a/140b, it is impossible to unload or load the substrate 100.

Figure 7:
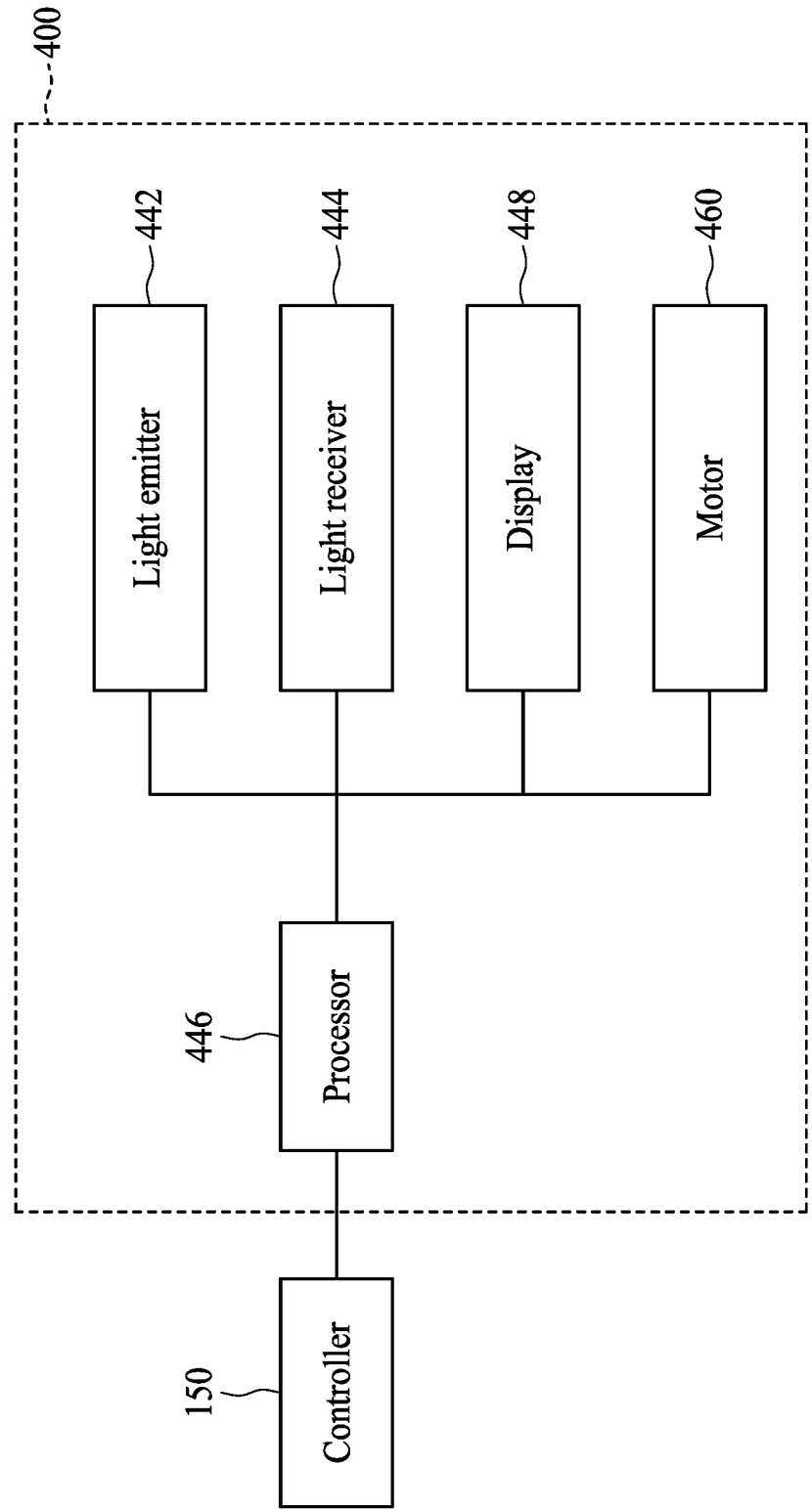
FIG. 7 is a circuit block diagram of an optical measuring module in accordance with some embodiments of the present disclosure.

A preset moving distance for moving the platform 430 along the guide rail 420 can be defined by the controller 150 of the substrate processing apparatus 10 electrically coupled to the motor 460, as shown in FIG. 7. However, the actual moving distance traveled by the platform 430 along the guide rail 420 may vary from the preset moving distance due to the mechanical deviation. Therefore, a real-time detection method for acquiring the actual moving distance traveled by the platform 430 along the guide rail 420 is needed.

Figure 8:
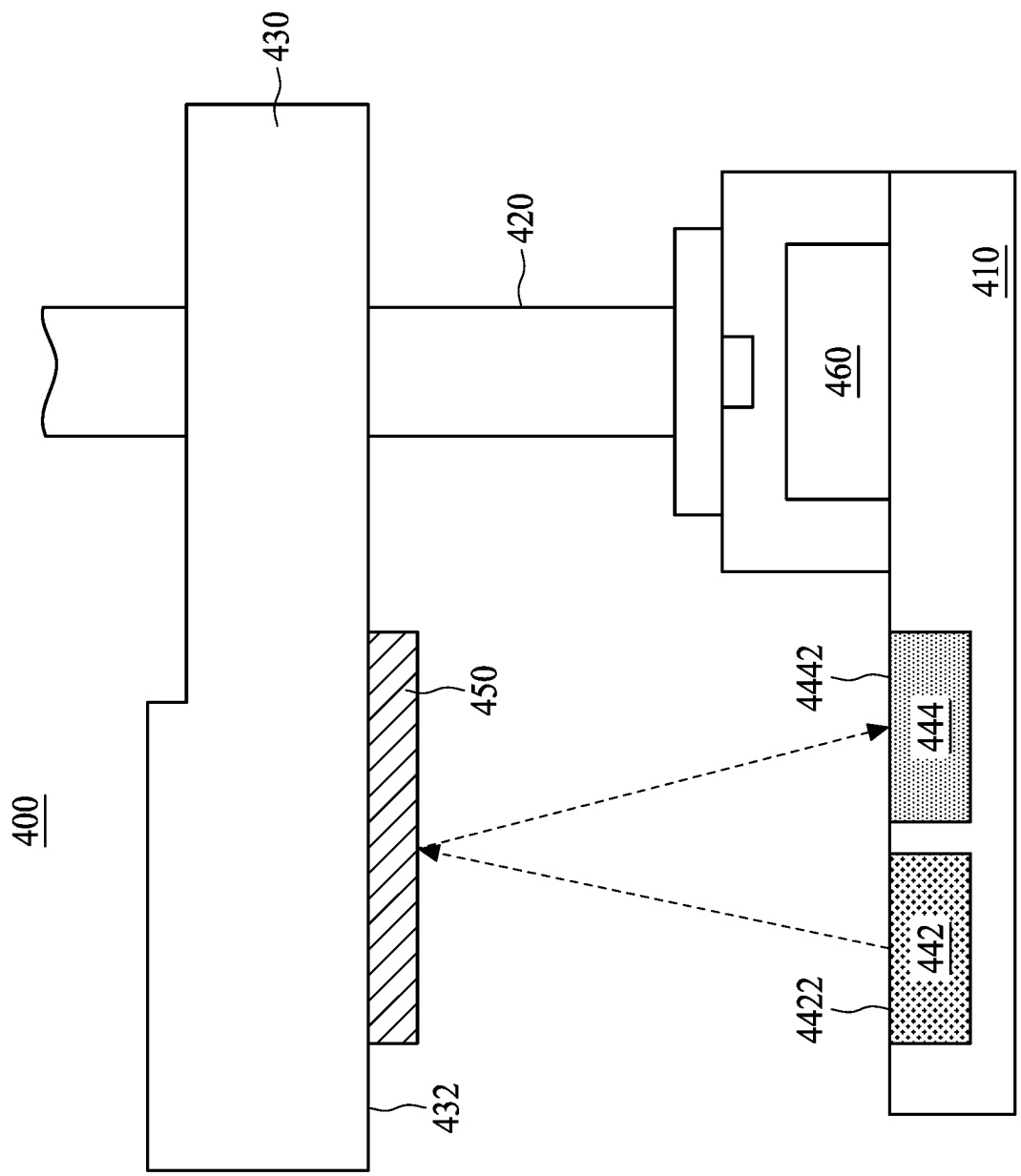
FIG. 8 is a close-up view of the load lock device in accordance with some embodiments of the present disclosure.

FIG. 8 is a close-up view of the load lock device 400 in accordance some embodiments of the present disclosure. Referring to FIGS. 7 and 8, the optical measuring module 440 for acquiring the actual moving distance traveled by the platform 430 includes a light emitter 442 for generating light having a specific wavelength and a light receiver 444 for receiving light having the specific wavelength. The optical measuring module 440 can further include a processor 446 electrically coupled to the light emitter 442 and the light receiver 444 and configured to determine the actual moving distance traveled by the platform 430 along the guide rail 420 based on an amount of light impinging on the light receiver 444. In some embodiments, the processor 446 can be integrated with the light receiver 444 to create a compact optical measuring device 400.

The light emitter 442 can include a light-emitting surface 4422 from which light generated by the light emitter 442 is emitted, wherein the light-emitting surface 4422 faces the platform 430. In some embodiments, the light emitter 442 can include a laser diode for generating a visible light beam or an invisible light beam, such as an infrared light beam. In alternative embodiments, the light emitter 442 can include at least one light-emitting diode (LED) or at least one light bulb for generating visible light or invisible light.

The light receiver 444 includes a light-receiving surface 4442 where light is incident upon the light receiver 444. The light-receiving surface 4442 faces the platform 430. In some embodiments, the light-emitting surface 4422 and the light-receiving surface 4442 exposed to the base 410 can be located at the same horizontal level. The light receiver 444 can include one or more photodiodes.

Light generated by the light emitter 442 is projected onto a lower surface 432 of the platform 430, wherein the processor 446 is capable of controlling an emission intensity of light generated by the light emitter 442. The light receiver 444 receives light diffused and reflected by the lower surface 432 of the platform 430 and impinging on the light-receiving surface 4442, and the light receiver 444 generates signals based on an amount of the received light impinging on the light-receiving surface 4442. The signals generated by the light receiver 444 can be transmitted in real time to the processor 446 and displayed on a display 448 electrically coupled to the processor 446.

In some embodiments, the processor 446 can determine the actual distance traveled by the platform 430 along the guide rail 420 merely by the signals indicating an intensity variation of the reflected light. More particularly, the intensity of the light is inversely proportional to the square of the distance from the light emitter 442. Hence, as the actual moving distance traveled by the platform 430 along the guide rail 420 increases, the intensity of the light impinging on the light-receiving surface 4442 of the light receiver 444 decreases with the square of the distance. By the use of the inverse-square law of light mentioned above, the actual moving distance traveled by the platform 430 along the guide rail 420 can be obtained.

In some embodiments, the processor 446 can be configured to compare the preset moving distance derived from the controller 150 to the actual moving distance. The processor 446 records comparison results and may provide the comparison results to the display 448. If a difference between the preset moving distance and the actual moving distance is greater than a threshold, and as a result the substrate retainer 1224 extends into the cassette 300 while the opened gate valve 140a is offset from the selected substrate 100 or the spaced stage in the cassette 300, an alarm is issued by the processor 446 to inform on-site technicians to turn off the load lock device 400, thereby reducing costs resulting from substrate scraping.

In some embodiments, a light reflector 450 is optionally oriented on the lower surface 432 of the platform 430 and in an optical propagation path of light to direct light generally to the light receiver 444. After being directed by the light reflector 446, an amount of reflected light impinging on the light-receiving surface 4442 is increased, thereby improving the reliability and accuracy of the signals generated by the light receiver 444.

Figure 9:
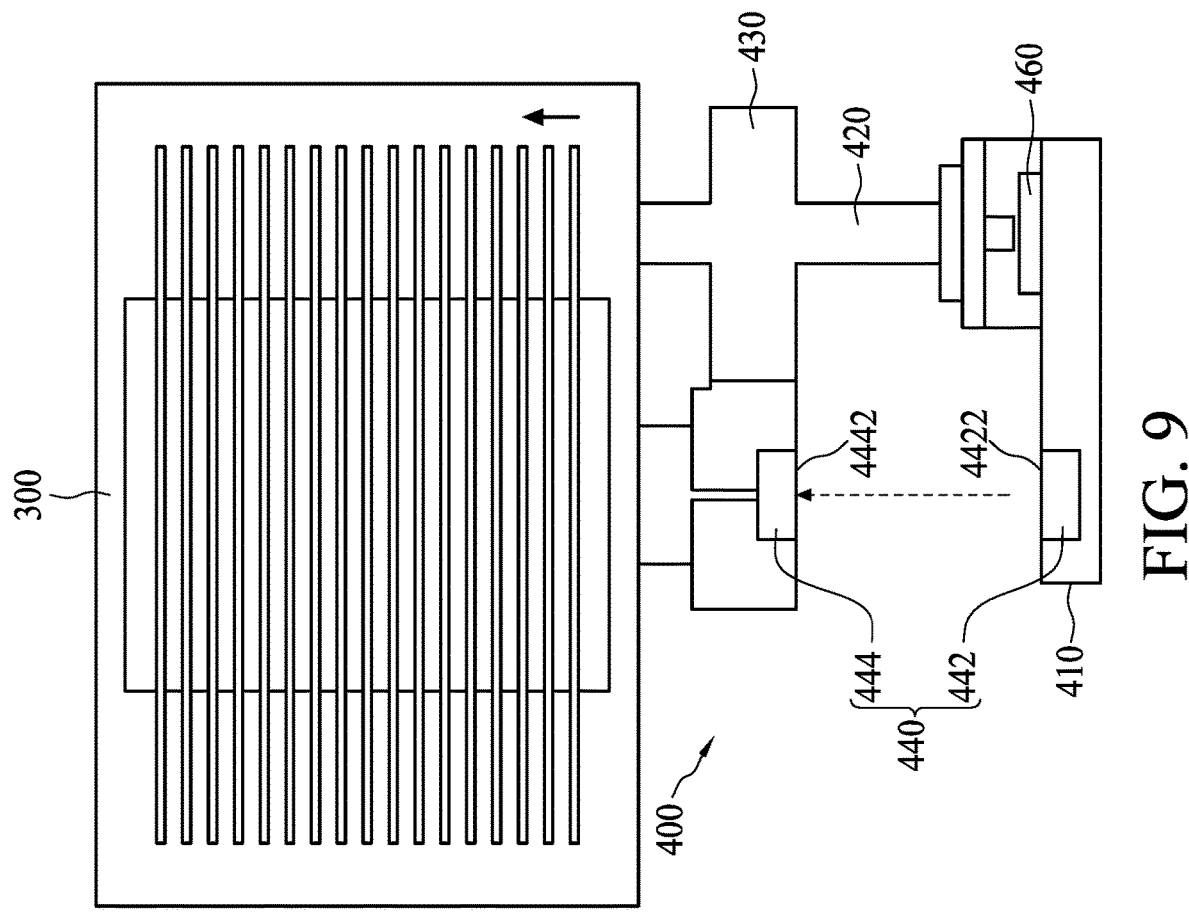
FIGS. 9 and 10 are cross-sectional views of a load lock device for carrying a cassette in accordance with some embodiments of the present disclosure.
Figure 10:
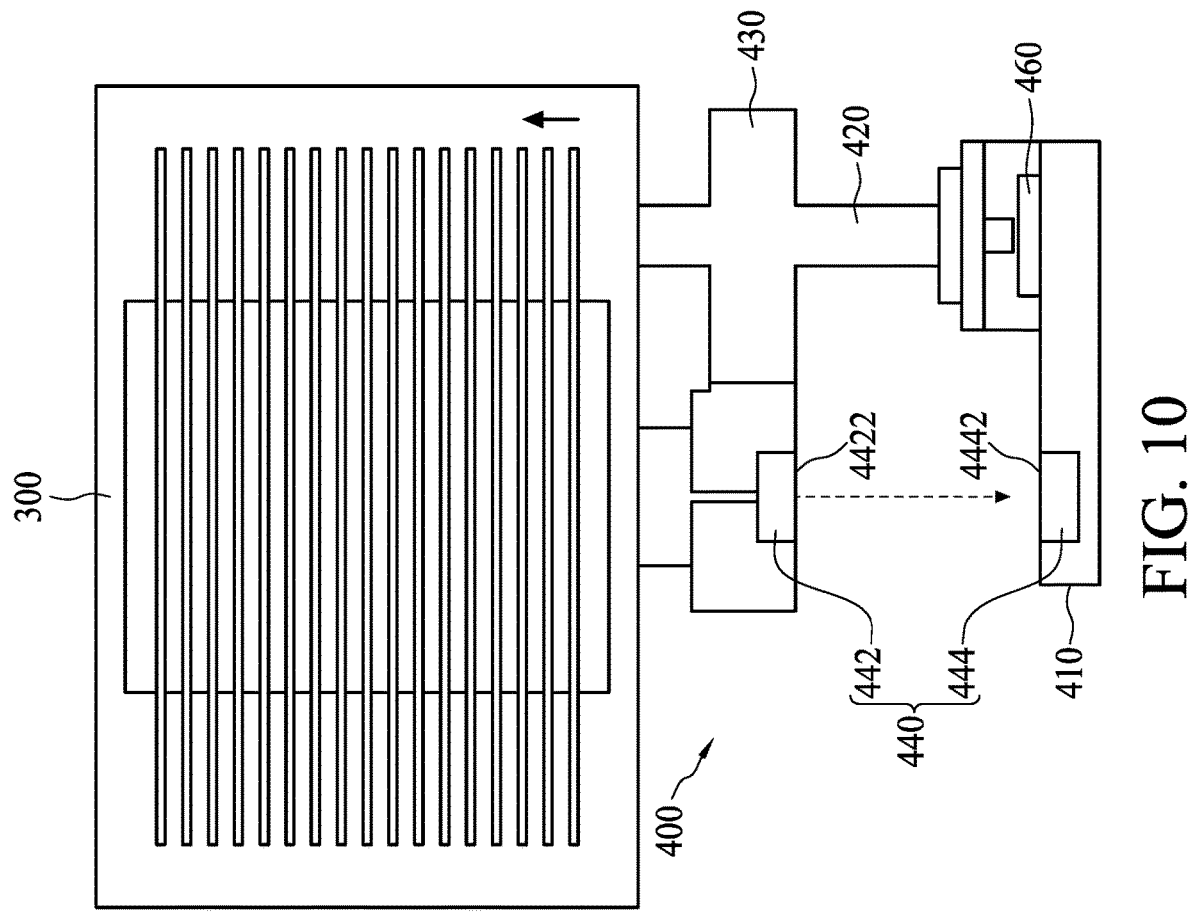

FIGS. 9 and 10 are cross-sectional views of a cassette 300 and a load lock device 400 in the input/output chamber 130 in accordance with some embodiments of the present disclosure. Referring to FIGS. 9 and 10, the load lock device 400 includes a base 410, a guide rail 420 mounted on the base 410, a platform 430 movably disposed on the guide rail 420, and a motor 460 coupled to the platform 430 and configured to drive the platform 430 to move upward and downward with respect to the base 410, so as to move the entire cassette 300 holding a batch of spaced substrates 100 up and down.

The load lock device 400 further includes an optical measuring module 440 employed to acquire an actual moving distance traveled by the platform 430 along the guide rail 420. The optical measuring module 440 includes a light emitter 442 for generating at least one light pulse having a specific wavelength and a light receiver 444 for receiving the light pulse having the specific wavelength.

The light emitter 442 includes a light-emitting surface 4422, and the light receiver 444 includes a light-receiving surface 4442, wherein the light-emitting surface 4422 faces the light-receiving surface 4442 after the optical measuring module 440 is completely assembled. Specifically, the light emitter 442 is disposed on one of the base 410 and the platform 430, and the light receiver 444 is disposed on the other one of the base 410 and the platform 430. For example, the light receiver 444 is disposed on a lower surface of the platform 430, and the light emitter 442 is disposed on the base 410 and projects light toward the light receiver 444, as shown in FIG. 9. Alternatively, the light emitter 442 can be disposed on the lower surface of the platform 430 and project light to the light receiver 444 mounted on the base 410, as shown in FIG. 10. In some embodiments, the light emitter 442 disposed on one of the base 410 and the platform 430 is properly aligned with the light receiver 444 disposed on the other one of the base 410 and the platform 430, so that the light pulse generated by the light emitter 442 can directly impinge on the light-receiving surface 4442 of the light receiver 444.

Referring to FIGS. 7, 9 and 10, the optical measuring module 440 can further include a processor 446 electrically coupled to the light emitter 442, the light receiver 444 and the motor 460 and configured to determine the actual moving distance traveled by the platform 430 along the guide rail 420 based on a travel time of the light pulse from the light emitter 442 to the light receiver 444. In some embodiments, the processor 446 is capable of controlling emission intensity and period of light pulses generated by the light emitter 442.

In some embodiments, the processor 446 can record time points of the light pulse emitted by the light emitter 442 and received by the light receiver 444, determine a period of time during the light pulse propagation from the light emitter 442 to the light receiver 444, and then calculate the actual moving distance traveled by the platform 430 (i.e., the distance between the base 410 and the platform 430) based on the period of time. In alternative embodiments, the processor 446 can determine, by using the inverse-square law of light, the actual distance traveled by the platform 430 based on the intensity of the light pulse received by the light receiver 444.

In conclusion, with the configuration of the load lock device 400 including the optical measuring module 440, the actual moving distance traveled by the platform 430 along the guide rail 420 can be monitored, thereby reducing costs resulting from substrate scraping.

One aspect of the present disclosure provides a substrate processing apparatus. The substrate processing apparatus comprises a controller and at least one input/output chamber provided with a load lock device. The load lock device includes a base, a guide rail, a platform and an optical measuring module. The guide rail is connected to the base. The platform, carrying a cassette for holding a batch of spaced substrates, is movably disposed on the guide rail. The optical measuring module is configured to acquire an actual moving distance traveled by the platform along the guide rail based on at least one optical signal reflected from the platform. The optical measuring module comprises a processor electrically coupled to the controller.

One aspect of the present disclosure provides a substrate processing apparatus. The substrate processing apparatus comprises a controller and at least one input/output chamber provided with a load lock device. The load lock device comprises a base, a guide rail, a platform and an optical measuring module. The guide rail is connected to the base. The platform, carrying a cassette for holding a batch of spaced substrates, is movably disposed on the guide rail. The optical measuring module is electrically coupled to the controller and configured to acquire an actual moving distance traveled by the platform along the guide rail based on at least one optical signal transmitted directly from a light emitter to a light receiver.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A substrate processing apparatus, comprising:
a controller; and
at least one input/output chamber comprising a load lock device, the load lock device comprising:
   a base;
   a guide rail connected to the base;
   a platform, carrying a cassette for holding a batch of spaced substrates, the platform being movably disposed on the guide rail; and
   an optical measuring module configured to acquire an actual moving distance traveled by the platform along the guide rail based on at least one optical signal reflected from the platform, wherein the optical measuring module comprises a processor electrically coupled to the controller.

2. The substrate processing apparatus of claim 1, wherein the load lock device further comprises a motor electrically coupled to the processor and configured to move the platform upward and downward along the guide rail, wherein the controller is configured to generate a preset moving distance for moving the platform, wherein the preset moving distance is provided to the processor and eventually the motor, and the processor is configured to compare a difference between the preset moving distance and the actual moving distance and issue an alarm if the difference is greater than a threshold.

3. The substrate processing apparatus of claim 2, wherein the optical measuring module further comprises a display for displaying the actual moving distance and a comparison result.

4. The substrate processing apparatus of claim 1, wherein the optical measuring module further comprises:
   a light emitter electrically coupled to the processor and configured to generate light having a specific wavelength; and
   a light receiver electrically coupled to the processor and configured to receive light having the specific wavelength,
   wherein light generated by the light emitter is projected to the platform, reflected by the platform, and impinges on the light receiver, and the processor is configured to determine the actual moving distance traveled by the platform along the guide rail based on an amount of light impinging on the light receiver.

5. The substrate processing apparatus of claim 4, wherein the optical measuring module further comprises a light reflector disposed on the platform and in an optical propagation path of light to direct light generally to the light receiver.

6. The substrate processing apparatus of claim 4, wherein the light emitter and the light receiver are disposed on the base.

7. The substrate processing apparatus of claim 1, wherein the optical measuring module further comprises:
   a light emitter electrically coupled to the processor and configured to generate at least one light pulse having a specific wavelength; and
   a light receiver electrically coupled to the processor and configured to receive a light pulse having the specific wavelength,
   wherein the light pulse generated by the light emitter is projected to the platform, reflected by the platform, and impinges on the light receiver, and the processor is configured to determine the actual moving distance traveled by the platform along the guide rail based on a travel time of the light pulse from the light emitter to the light receiver.

8. The substrate processing apparatus of claim 1, further comprising:
   a transfer chamber comprising a handler electrically coupled to the controller; and
   a processing chamber provided with an ion implant device for implanting the substrates.

9. The substrate processing apparatus of claim 8, further comprising a plurality of gate valves electrically coupled to the controller, wherein the gate valves, during a close operation, are employed to hermetically isolate the input/output chamber from the processing chamber, and the gate valves, during an open operation, allow the handler to load and unload the substrates.

10. A substrate processing apparatus, comprising:
a controller; and
at least one input/output chamber comprising a load lock device, the load lock device comprising:
   a base;
   a guide rail connected to the base;
   a platform, carrying a cassette for holding a batch of spaced substrates, the platform being movably disposed on the guide rail; and
   an optical measuring module electrically coupled to the controller and configured to acquire an actual moving distance traveled by the platform along the guide rail based on at least one optical signal transmitted directly from a light emitter to a light receiver.

11. The substrate processing apparatus of claim 10, wherein the light emitter and the light receiver are disposed on the base and the platform, respectively.

12. The substrate processing apparatus of claim 10, wherein the actual moving distance traveled by the platform along the guide rail is determined based on an amount of light impinging on the light receiver.

13. The substrate processing apparatus of claim 10, wherein the actual moving distance traveled by the platform along the guide rail is determined based on a travel time of the light pulse from the light emitter to the light receiver.

14. The substrate processing apparatus of claim 10, wherein the optical measuring module further includes a processor electrically coupled to the light emitter and the light receiver, the load lock device further comprises a motor electrically coupled to the processor and configured to move the platform upward and downward along the guide rail, the controller is configured to generate a preset moving distance for moving the platform, wherein the preset moving distance is provided to the processor and eventually the motor, and the processor is configured to compare a difference between the preset moving distance and the actual moving distance and issue an alarm if the difference is greater than a threshold.

15. The substrate processing apparatus of claim 14, wherein the optical measuring module further comprises a display for displaying the actual moving distance and a comparison result provided by the processor.

16. The substrate processing apparatus of claim 10, further comprising:
- a transfer chamber comprising a handler electrically coupled to the controller;
- a processing chamber provided with an ion implant device for implanting the substrates; and
- a plurality of gate valves electrically coupled to the controller, wherein the gate valves, during a close operation, are employed to hermetically isolate the input/output chamber from the processing chamber, and the gate valves, during an open, operation allow the handler to load and unload the substrates.

* * * * *